(12) United States Patent
Mizuno et al.

(10) Patent No.: US 10,995,196 B2
(45) Date of Patent: May 4, 2021

(54) THERMALLY CONDUCTIVE SHEET AND METHOD FOR MANUFACTURING THERMALLY CONDUCTIVE SHEET

(71) Applicant: KITAGAWA INDUSTRIES CO., LTD., Inazawa (JP)

(72) Inventors: Takashi Mizuno, Kasugai (JP); Yasuhiro Kawaguchi, Kasugai (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 155 days.

(21) Appl. No.: 16/093,299

(22) PCT Filed: Mar. 29, 2017

(86) PCT No.: PCT/JP2017/012862
§ 371 (c)(1),
(2) Date: Oct. 12, 2018

(87) PCT Pub. No.: WO2017/187870
PCT Pub. Date: Nov. 2, 2017

(65) Prior Publication Data
US 2019/0127550 A1    May 2, 2019

(30) Foreign Application Priority Data
Apr. 27, 2016   (JP) .............................. JP2016-088912

(51) Int. Cl.
| | |
|---|---|
| C08K 3/22 | (2006.01) |
| B29C 43/06 | (2006.01) |
| B29C 43/46 | (2006.01) |
| C08J 5/18 | (2006.01) |
| H05K 7/20 | (2006.01) |
| H01L 21/48 | (2006.01) |
| C08J 3/18 | (2006.01) |
| H01L 23/373 | (2006.01) |
| B29C 43/00 | (2006.01) |
| B29C 43/18 | (2006.01) |
| B32B 27/08 | (2006.01) |
| B32B 27/18 | (2006.01) |
| B32B 27/30 | (2006.01) |
| C08K 5/00 | (2006.01) |
| B29K 33/00 | (2006.01) |
| B29K 509/02 | (2006.01) |

(52) U.S. Cl.
CPC .............. *C08K 3/22* (2013.01); *B29C 43/003* (2013.01); *B29C 43/06* (2013.01); *B29C 43/18* (2013.01); *B29C 43/46* (2013.01); *B32B 27/08* (2013.01); *B32B 27/18* (2013.01); *B32B 27/308* (2013.01); *C08J 3/18* (2013.01); *C08J 5/18* (2013.01); *H01L 21/4871* (2013.01); *H01L 23/3737* (2013.01); *H05K 7/20* (2013.01); *H05K 7/20436* (2013.01); *B29K 2033/08* (2013.01); *B29K 2509/02* (2013.01); *B29K 2995/0013* (2013.01); *B32B 2264/102* (2013.01); *B32B 2307/302* (2013.01); *C08J 2300/12* (2013.01); *C08J 2333/06* (2013.01); *C08J 2333/08* (2013.01); *C08K 5/005* (2013.01); *C08K 5/0016* (2013.01); *C08K 2003/2224* (2013.01); *C08K 2003/2227* (2013.01); *C08K 2201/001* (2013.01); *C08K 2201/005* (2013.01); *C08K 2201/014* (2013.01)

(58) Field of Classification Search
None
See application file for complete search history.

(56) References Cited

U.S. PATENT DOCUMENTS

| | | |
|---|---|---|
| 9,966,324 B2 | 5/2018 | Aramaki et al. |
| 2015/0004388 A1 | 1/2015 | Kawaguchi et al. |
| 2015/0299550 A1 | 10/2015 | Kusunoki et al. |
| 2016/0104657 A1 | 4/2016 | Aramaki et al. |
| 2016/0355000 A1 | 12/2016 | Matsushima |
| 2017/0291391 A1* | 10/2017 | Oya .................... B29C 48/154 |

FOREIGN PATENT DOCUMENTS

| | | |
|---|---|---|
| CN | 103987790 | 8/2014 |
| JP | 2009-062214 | 3/2009 |
| JP | 2010-111757 | 5/2010 |
| JP | 2014-123615 | 7/2014 |
| JP | 2015-010130 | 1/2015 |
| JP | 2015-029071 | 2/2015 |
| JP | 2015-198144 | 11/2015 |

OTHER PUBLICATIONS

International Search Report dated Jun. 27, 2017 in International Application No. PCT/JP2017/012862.

* cited by examiner

*Primary Examiner* — Sanza L. McClendon
(74) *Attorney, Agent, or Firm* — Wenderoth, Lind & Ponack, L.L.P.

(57) ABSTRACT

A thermally conductive sheet including: an acrylic polymer; a high-soda alumina in an amount of 70 to 75% by volume; and a magnesium hydroxide having a particle size smaller than a particle size of the high-soda alumina in an amount of 2.7 to 5.3% by volume, the magnesium hydroxide is coated with a higher fatty acid. The thermally conductive sheet has a compressive force required in a deformation with a compressibility of 20% or less of 200 N or less, and has a thermal resistance of 0.45° C./W or less.

4 Claims, 1 Drawing Sheet

THERMALLY CONDUCTIVE SHEET AND METHOD FOR MANUFACTURING THERMALLY CONDUCTIVE SHEET

TECHNICAL FIELD

The present invention relates to a thermally conductive sheet and a method for manufacturing the thermally conductive sheet.

BACKGROUND ART

Conventionally suggested as a thermally conductive sheet for transferring a heat that is generated from an electronic device, an element, or the like, to a heat sink, has been a thermally conductive sheet prepared by filling an acrylic resin with a thermally conductive filler such as aluminum oxide (alumina) or the like having a high thermal conductivity (see Patent Document 1).

RELATED ART DOCUMENT

Patent Document

Patent Document 1: Japanese Unexamined Patent Application Publication No. 2010-111757

Problem to be Solved by the Invention

In order to enhance a thermal conductivity of this type of thermally conductive sheet, it is preferred that a heat transfer path made of a thermally conductive filler be made as continuous as possible and be secured as many as possible. In other words, it is preferred to increase filling density of the thermally conductive filler. However, when a filling density is increased, a sheet has an increased hardness, and becomes hard to be adhered tightly without a gap to an electronic device or an element that are heating elements.

In addition, in this type of thermally conductive sheet, a thin resin layer is formed on a surface of the sheet due to manufacturing method thereof. Such a resin layer on a sheet surface interferes with a direct contact between a thermally conductive filler in the sheet and an electronic device or an element, which causes a problem that a thermal conductivity is lowered.

DISCLOSURE OF THE PRESENT INVENTION

The present invention has been accomplished on the basis of the above circumstances, and an object thereof is to provide a thermally conductive sheet that requires a low compressive force and has an excellent thermal conductivity, and a method for manufacturing the thermally conductive sheet.

Means for Solving the Problem

The present invention achieved in order to solve the above problems is a thermally conductive sheet including: an acrylic polymer; a high-soda alumina in an amount of 70 to 75% by volume; and a magnesium hydroxide having a particle size smaller than a particle size of the high-soda alumina in an amount of 2.7 to 5.3% by volume, the magnesium hydroxide is coated with a higher fatty acid.

The thermally conductive sheet has a compressive force required in a deformation with a compressibility of 20% or less of 200 N or less. The thermally conductive sheet has a thermal resistance of 0.45° C./W or less.

According to such a thermally conductive sheet, the use of the high-soda alumina allows a thermal resistance to be reduced and a compressive force to be kept low, as compared with a case of using a low-soda alumina.

In addition, by covering the surfaces of the high-soda alumina particles with the magnesium hydroxide coated with a higher fatty acid, it becomes easy for the high-soda alumina particles adjacent to each other in the thermally conductive sheet to slip and slide from each other, when a force acts to crush the thermally conductive sheet. That is, the sheet has a reduced hardness and an increased viscosity to become easily deformable (to lower a compressive force).

The high-soda alumina of the thermally conductive sheet may be one that may be prepared by mixing a small particle size alumina with an average particle size of 2 μm to 10 μm and a large particle size alumina with an average particle size of 50 μm to 100 μm, at a volume ratio of 2:3 to 2:5.

By using such a structure, the small particle size alumina is dispersed in gaps among the large particle size alumina to increase a filling density and to secure a larger number of thermal conduction paths, and as a result, a thermal conductivity is further improved. In this connection, a volume ratio between the small particle size alumina and the large particle size alumina may preferably be 2:3 to 2:5. A too much increased proportion of the small particle size alumina increases a frictional force among the particles to cause a higher viscosity and hardness of the sheet. A too much increased proportion of the large particle size alumina makes mixing and kneading of constituent materials difficult.

The present invention also relates to a method for manufacturing the thermally conductive sheet, the method including: a mixing step of mixing an acrylic resin in an amount of 20 to 25 parts by weight including a polymer prepared by polymerizing a monomer including a (meth)acrylic acid ester, and a (meth)acrylic acid ester, a high-soda alumina in an amount of 250 to 300 parts by weight, a magnesium hydroxide in an amount of 4 to 13 parts by weight that has a particle size smaller than a particle size of the high-soda alumina and is coated with a higher fatty acid, a polyfunctional monomer in an amount of 0.005 to 0.05 parts by weight, a polymerization initiator in an amount of 0.1 to 0.3 parts by weight of, a plasticizer in an amount of 1.2 to 2.8 parts by weight, and an antioxidant in an amount of 0.02 to 0.2 parts by weight; a forming step of forming a mixture obtained in the mixing step into a sheet shape by extruding the mixture through a dye head toward between a pair of plastic sheets facing each other; and a curing step heating and curing a formed material formed in the forming step.

According to such a manufacturing method, flexibility is imparted to the sheet by the plasticizer, and a (co)polymerization reaction of the acrylic resin is suppressed by the antioxidant to some extent, and as a result, increase in hardness of the sheet is suppressed. In this way, by imparting flexibility to a sheet and reducing a hardness of a sheet, it is possible to easily adhere the thermally conductive sheet to an adherend closely.

In addition, when an acrylic polymer having a low hardness and flexibility is used as a binder resin and is extruded between a pair of plastic sheets to form a sheet, a resin skin layer that is formed on a surface of a thermally conductive sheet can be made very thin. Accordingly, a high-soda alumina or the like as the thermally conductive filler in a thermally conductive sheet can be brought into a state of being very close to an adherend, or a state of being exposed on a surface of a sheet so as to be in direct contact with an adherend, to improve a thermal conductivity (to lower a thermal resistance).

Advantageous Effect of the Invention

According to the present invention, it is possible to provide a thermally conductive sheet that requires a low compressive force and has an excellent thermal conductivity, and a method for manufacturing the thermally conductive sheet.

MODE FOR CARRYING OUT THE INVENTION

The thermally conductive sheet of the present invention includes: an acrylic polymer; a high-soda alumina in an amount of 70 to 75% by volume; and a magnesium hydroxide in an amount of 2.7 to 5.3% by volume that has a particle size smaller than that of the high-soda alumina and is coated with a higher fatty acid.

In the present invention, the acrylic polymer refers to one obtained by polymerizing or copolymerizing an acrylic resin containing: a polymer obtained by polymerizing a monomer containing a (meth)acrylic acid ester; and a (meth)acrylic acid ester.

Examples of the (meth)acrylic acid ester may include ethyl(meth)acrylate, n-propyl(meth)acrylate, i-propyl(meth)acrylate, n-butyl(meth)acrylate, i-butyl(meth)acrylate, 2-ethylhexyl(meth)acrylate, n-hexyl(meth)acrylate, n-amyl (meth)acrylate, i-amyl(math) acrylate, octyl(meth)acrylate, i-octyl(meth)acrylate, i-myristyl(meth)acrylate, lauryl (meth)acrylate, nonyl(meth)acrylate, i-nonyl(meth)acrylate, i-decyl(meth)acrylate, tridecyl(meth)acrylate, stearyl(meth) acrylate, i-stearyl(meth)acrylate, and the like. These may be used alone, or two or more of them may also be used in combination, at the time of (co) polymerization.

The acrylic polymer can be obtained by adding an additive such as a polyfunctional monomer, a polymerization initiator, a plasticizer, an antioxidant, or the like to the above-mentioned acrylic resin, and heating and curing the mixture.

Examples of the polyfunctional monomers may include those having two or more(meth)acryloyl groups in a molecule, and the like. Examples of bifunctional (meth)acrylate monomer having two (meth)acryloyl groups in a molecule may include 1,3-butylene glycol di(meth)acrylate, 1,4-butanediol di(meth)acrylate, 1,6 hexanediol di(meth)acrylate, 1,9-nonanediol di(meth)acrylate, neopentyl glycol di(meth) acrylate, dicyclopentanyl di(meth)acrylate, 2-ethyl-2-butyl-propanediol(meth)acrylate, neopentyl glycol-modified trimethylolpropane di(meth)acrylate, stearic acid-modified pentaerythritol diacrylate, polypropylene glycol di(meth) acrylate 2,2-bis [4-(meth)acryloxydiethoxyphenyl]propane, 2,2-bis [4-(meth)acryloxypropoxyphenyl]propane, 2,2-bis [4-(meth)acryloxytetraethoxy phenyl]propane, and the like.

Examples of trifunctional (meth)acrylate monomers may include trimethylolpropane tri(meth)acrylate, tris [(meth) acryloxyethyl]isocyanurate, and the like; and examples of tetrafunctional or higher functional (meth)acrylate monomer may include dimethylolpropane tetra(meth)acrylate, pentaerythritol tetra(meth)acrylate, pentaerythritol ethoxy tetra (meth)acrylate, dipentaerythritol penta(meth)acrylate, dipentaerythritol hexa(meth)acrylate, and the like.

Among these polyfunctional monomers, 1,6-hexanediol di(meth)acrylate, and the like are preferred.

The polyfunctional monomer described above is preferably blended at a proportion of 0.005 to 0.05 parts by weight with respect to 20 to 25 parts by weight of the acrylic resin.

Examples of the polymerization initiator may include organic peroxides such as di-(4-t-butylcyclohexyl) peroxydicarbonate, lauroyl peroxide, t-amyl peroxy-2-ethylhexanoate, benzoyl peroxide, t-butyl peroxy-2-ethylhexanoate, and the like. Among these polymerization initiators, di-(4-t-butylcyclohexyl)peroxydicarbonate is preferred.

The polymerization initiator is preferably blended at a proportion of 0.1 to 0.3 parts by weight with respect to 20 to 25 parts by weight of the acrylic resin.

As the plasticizer, a commonly used plasticizer can be used, and for example, phthalic acid-based, adipic acid-based, phosphoric acid-based, trimellitic acid-based, polyester-based ones, and the like are suitable. Among these plasticizers, any one kind may be used alone, or a mixture of two or more kinds may also be used. By blending a plasticizer, flexibility is imparted to a thermally conductive sheet.

The plasticizer is preferably blended at a proportion of 1.2 to 2.8 parts by weight with respect to 20 to 25 parts by weight of the acrylic resin. When the blending proportion of the plasticizer is small, the effect of adding the plasticizer is weakened, and a hardness of a thermally conductive sheet is increased. When a blending proportion of the plasticizer is too large, there is a tendency that the plasticizer oozes out (bleeds) from a surface of a thermally conductive sheet.

As the antioxidant, for example, phenolic antioxidant having a radical scavenging action may be used. When such an antioxidant is blended, it is possible to suppress a polymerization reaction of the acrylic resin at the time of manufacturing the sheet, to thereby keep a hardness of the sheet low.

The antioxidant is preferably blended at a proportion of 0.02 to 0.2 parts by weight with respect to 20 to 25 parts by weight of the acrylic resin. When blending proportion of the antioxidant is small, the polymerization reaction of the acrylic resin develops to increase hardness of the sheet. When blending proportion of the antioxidant is high, there is a tendency that a resin is inhibited from curing.

On the other hand, the high-soda alumina as the thermally conductive filler has a substantially spherical shape and is blended at a proportion of 250 to 300 parts by weight, with respect to 20 to 25 parts by weight of the acrylic resin. A blending proportion thereof to the entire thermally conductive sheet volume is set to 70 to 75% by volume.

In this connection, the high-soda alumina refers to one having a soluble sodium content of 100 ppm or more, and in the present invention, it is more preferred to use one with the content of 120 ppm or more. The soluble sodium content refers to an amount, of sodium ion ($Na^+$) to be dissolved in water when the high-soda alumina is brought into contact with the water.

The high-soda alumina described above may be one containing a small particle size alumina with an average particle size of 2 μm to 10 μm and a large particle size alumina with an average particle size of 50 μm to 100 μm, mixed at a volume ratio of 2:3 to 2:5. Any of these alumina has a substantially spherical shape, and the particle size thereof is indicated by an average particle size D50 obtained by a laser diffraction method or the like.

When particle sizes of a high-soda alumina are in such a blend, it is possible to increase a filling density of the high-soda alumina in a thermally conductive sheet.

Those preferred as the magnesium hydroxide coated with a higher fatty acid have an average particle size of 0.5 μm to 1.5 μm. In this connection, the particle size is indicated by an average particle size D50 obtained by a laser diffraction method or the like.

Examples of the higher fatty acid that coat the magnesium hydroxide may include palmitic acid, stearic acid, oleic acid, linoleic acid, and the like.

The magnesium hydroxide is blended at a proportion of 4 to 13 parts by weight with respect to 20 to 25 parts by weight of the acrylic resin. A blending proportion thereof to an entire thermally conductive sheet volume is set to 2.7 to 5.3% by volume.

Such a thermally conductive sheet of the present embodiment is obtained by carrying out: a mixing step of mixing the above-described acrylic resin, the high-soda alumina, the magnesium hydroxide that has a particle size smaller than that of the high-soda alumina and is coated with a higher fatty acid, a polyfunctional monomer, a polymerization initiator, a plasticizer, and an antioxidant; a forming step of forming the mixture obtained in the mixing step into a sheet shape by extruding the mixture toward between a pair of plastic sheets facing each other; and a curing step of heating and curing the formed material formed in the forming step.

Figure 1:
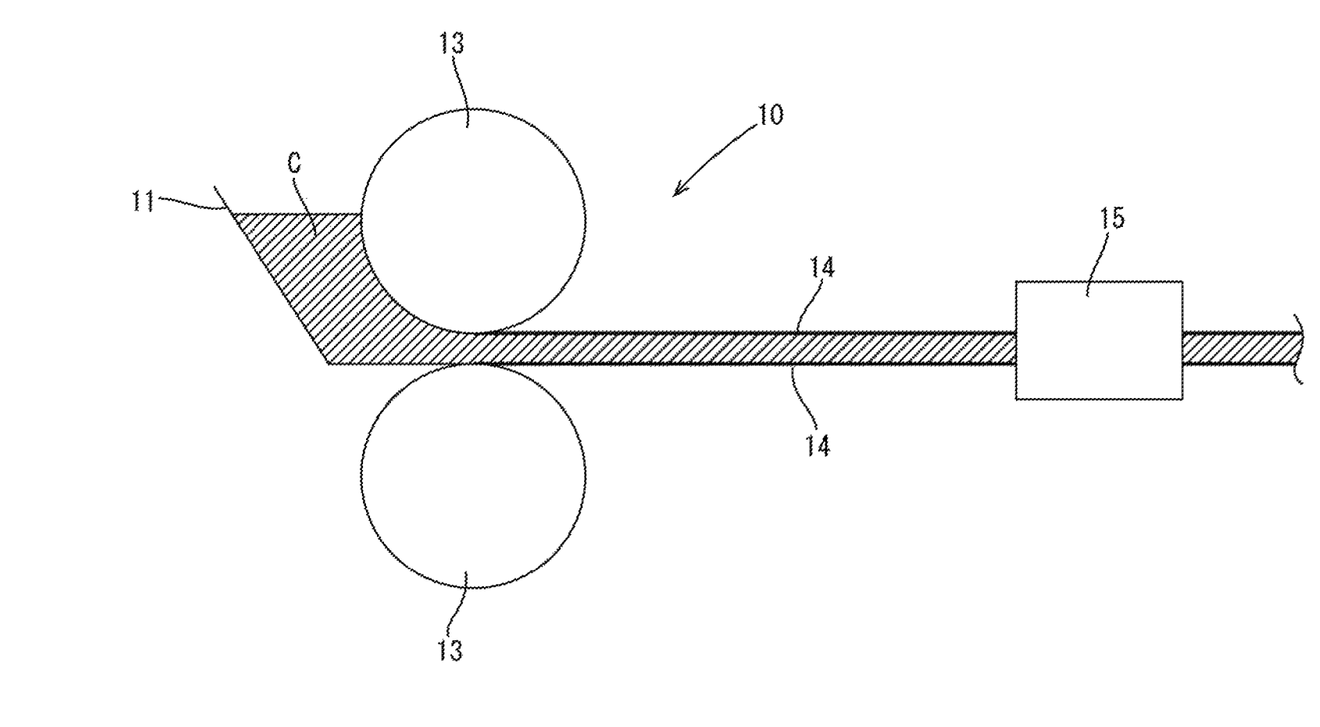
FIG. 1 is a schematic view of a coater.

Among them, in the forming step, a coater can be used. As shown in FIG. 1, a coater 10 is equipped with a pair of rolls 13, 13 disposed to face each other in an up-and-down direction, with the lower end of a hopper 11 opening toward between the pair of rolls 13, 13. Polymeric films 14, 14 are respectively wound around the pair of rolls 13, 13, and with rotation of the rolls 13, 13, the pair of polymeric films 14, 14 is delivered out in the same direction (the opposite direction to the hopper 11) with keeping a predetermined distance.

A mixture C obtained in the mixing step is extruded between the pair of polymeric films 14, 14 so as to be formed into a sheet shape (forming step). Thereafter, the formed mixture C is heated in a heating device 15, and is cured (curing step). In this manner, a thermally conductive sheet is produced.

TEST EXAMPLES

Hereinbelow, the present invention is described further in detail with reference to test examples.

1. Comparison and study of high-soda alumina and low-soda alumina (Production of Thermally Conductive Sheet)

To produce two kinds of samples in a sheet shapes of: 25 mm length×25 mm width×2 mm thickness (test piece of size A); and 10 mm length×10 mm width×1 mm thickness (test piece of size B), various materials were mixed at the blending proportions shown in Tables 1-1 to 1-3 and were kneaded (mixing step), and the resultant was formed by a coater 10 after air bubbles were removed by vacuum defoaming (forming step), cured by heating to 105° C. with a heating device 15, and then processed by cutting or the like.

As for alumina as a thermally conductive filler, a high-soda product and a low-soda product were prepared each in two particle sizes that were small particle size alumina with an average particle size of 2 μm to 10 μm, and a large particle size alumina with an average particle size of 50 μm to 100 μm. Then, as Example 1, the alumina was prepared by blending such that the small particle size alumina of the high-soda product was 23.7% by volume, and the large particle size alumina of the high-soda product was 47.3% by volume. As Comparative Example 1, the alumina was prepared by blending such that the small particle size alumina of the low-soda product was 23.7% by volume, and the large particle size alumina of the low-soda product was 47.3% by volume.

Each sample of the obtained size A test pieces was measured for thermal resistance by using a measuring device in conformity with ASTMD5470. Each sample of the size B test pieces was measured for compressive force required in a deformation with a compressibility of 20%, by using a measuring device (TENSILON Universal Testing Instrument RTC-1210A, manufactured by A&D Company, Limited). Results are also shown in Tables 1-1 to 1-3.

TABLE 1-1

| ITEM | BLENDED CONTENT | MATERIAL | ACRYLIC RESIN | POLYFUNCTIONAL MONOMER | POLYMERIZATION INITIATOR | PLASTI-CIZER | ANTI-OXIDANT |
|---|---|---|---|---|---|---|---|
| | | PRODUCT NUMBER | HD-A218 | 1.6HX-A | PERKADOX16 | | |
| | | SPECIFIC GRAVITY | 0.98 | 0.98 | 0.5 | 0.99 | 1.04 |
| | | AVERAGE PARTICLE SIZE | — | — | — | — | — |
| | | RANGE OF AVERAGE PARTICLE SIZE | — | — | — | — | — |
| COMPARATIVE EXAMPLE 1 | LOW-SODA PRODUCT ALUMINUM OXIDE | WEIGHT (g) | 20.98 | 0.021 | 0.21 | 2.0 | 0.05 |
| | | vol % | 22.4 | 0.000 | 0.40 | 2.1 | 0.1 |
| EXAMPLE 1 | HIGH-SODA PRODUCT ALUMINUM OXIDE | WEIGHT (g) | 20.98 | 0.021 | 0.21 | 2.0 | 0.05 |
| | | vol % | 22.4 | 0.022 | 0.44 | 2.1 | 0.05 |

TABLE 1-2

| ITEM | BLENDED CONTENT | MATERIAL | ALUMINUM OXIDE HIGH-SODA | ALUMINUM OXIDE LOW-SODA | ALUMINUM OXIDE HIGH-SODA | ALUMINUM OXIDE LOW-SODA | MAGNESIUM HYDROXIDE | SUM |
|---|---|---|---|---|---|---|---|---|
| | | PRODUCT NUMBER | | | | | | |
| | | SPECIFIC GRAVITY | 3.98 | 3.98 | 3.98 | 3.98 | 2.38 | |

TABLE 1-2-continued

| ITEM | BLENDED CONTENT | MATERIAL | ALUMINUM OXIDE HIGH-SODA | ALUMINUM OXIDE LOW-SODA | ALUMINUM OXIDE HIGH-SODA | ALUMINUM OXIDE LOW-SODA | MAGNESIUM HYDROXIDE | SUM |
|---|---|---|---|---|---|---|---|---|
| | | AVERAGE PARTICLE SIZE | 3 | 3 | 75 | 75 | 1.1 | |
| | | RANGE OF AVERAGE PARTICLE SIZE | 2-10 | 2-10 | 50-100 | 50-100 | 0.5-1.5 | |
| COMPARATIVE EXAMPLE 1 | LOW-SODA PRODUCT ALUMINUM OXIDE | WEIGHT (g) | | 90 | | 180 | 9 | 302.3 |
| | | vol % | | 23.7 | | 47.3 | 4.0 | 100.0 |
| EXAMPLE 1 | HIGH-SODA PRODUCT ALUMINUM OXIDE | WEIGHT (g) | 90 | | 180 | | 9 | 302.3 |
| | | vol % | 23.7 | | 47.3 | | 4.0 | 100.0 |

TABLE 1-3

| ITEM | BLENDED CONTENT | MATERIAL | THERMALLY CONDUCTIVE FILLER vol % WITH RESPECT TO TOTAL | THERMAL RESISTANCE (° C./W) | COMPRESSION FORCE (N) | TOTAL |
|---|---|---|---|---|---|---|
| | | PRODUCT NUMBER | | | | |
| | | SPECIFIC GRAVITY | | | | |
| | | AVERAGE PARTICLE SIZE | | | | |
| | | RANGE OF AVERAGE PARTICLE SIZE | | | | |
| COMPARATIVE EXAMPLE 1 | LOW-SODA PRODUCT ALUMINUM OXIDE | WEIGHT (g) vol % | 75.0 | 0.46 | LARGER THAN 200 | NO GOOD |
| EXAMPLE 1 | HIGH-SODA PRODUCT ALUMINUM OXIDE | WEIGHT (g) vol % | 75.0 | 0.41 | 160 OR LESS | GOOD |

From the results shown in Tables 1-1 to 1-3, it was confirmed that, when alumina in two particle sizes of the same blending proportion were used, both the thermal resistance and the compressive force became smaller in a case of using a high-soda product than in a case of using a low-soda product.

2. Study on Blending Proportion of Small Particle Size Alumina and Large Particle Size Alumina Various materials were mixed at the blending proportions shown in Tables 2-1 to 2-2 and were kneaded, and samples having a sheet shape similar to the above were produced.

Samples of alumina as the thermally conductive filler were produced with a small particle size alumina having an average particle size of 3 μm (high-soda product) and a large particle size alumina having an average particle size of 75 μm (high-soda product) as follows: blending proportions of the small particle size: the large particle size=1:1 (Comparative Example 2), 2:3 (Reference Example 1), 1:2 (Reference Example 2, Example 2), 2:5 (Reference Example 3), and 1:3 (Comparative Example 3).

Using the materials obtained in the mixing step, viscosity was measured by Brookfield method by using a measuring device (product name "Rotational viscometer", manufactured by EKO Instruments Co., Ltd.). In addition, samples of 20 mm length×50 mm width×10 mm thickness (test piece of size C) were measured for Asker C hardness by using a hardness tester (product name "ASKER C hardness tester", manufactured by Kobunshi Keiki Co., Ltd.). Results are also shown in Tables 2-1 to 2-2.

TABLE 2-1

| ITEM | BLENDED CONTENT | MATERIAL | ACRYLIC RESIN | POLYFUNCTIONAL MONOMER | POLYMERIZATION INITIATOR | PLASTICIZER | ANTIOXIDANT | ALUMINUM OXIDE |
|---|---|---|---|---|---|---|---|---|
| | | PRODUCT NUMBER | HD-A218 | 1.6HX-A | PERKADOX16 | | | |
| | | SPECIFIC GRAVITY | 0.98 | 0.98 | 0.5 | 0.99 | 1.04 | 3.98 |
| | | AVERAGE PARTICLE SIZE | — | — | — | — | — | 3 |

TABLE 2-1-continued

| ITEM | BLENDED CONTENT | MATERIAL | ACRYLIC RESIN | POLY-FUNCTIONAL MONOMER | POLYMER-IZATION INITIATOR | PLASTI-CIZER | ANTI-OXIDANT | ALUMINUM OXIDE |
|---|---|---|---|---|---|---|---|---|
| | | RANGE OF AVERAGE PARTICLE SIZE | — | — | — | — | — | 2-10 |
| COMPARATIVE EXAMPLE 2 | SMALL PARTICLE SIZE:LARGE PARTICLE SIZE = 1:1 | WEIGHT (g) vol % | 20.98 22.9 | 0.021 0.0 | 0.21 0.4 | 0.0 0.0 | 0.00 0.00 | 135 36.3 |
| REFERENCE EXAMPLE 1 | SMALL PARTICLE SIZE:LARGE PARTICLE SIZE = 2:3 | WEIGHT (g) vol % | 20.98 22.9 | 0.021 0.0 | 0.21 0.4 | 0.0 0.0 | 0.00 0.00 | 108 29.0 |
| REFERENCE EXAMPLE 2 | SMALL PARTICLE SIZE:LARGE PARTICLE SIZE = 1:2 | WEIGHT (g) vol % | 20.98 22.9 | 0.021 0.0 | 0.21 0.4 | 0.0 0.0 | 0.00 0.00 | 90 24.2 |
| EXAMPLE 2 | SMALL PARTICLE SIZE:LARGE PARTICLE SIZE = 1:2 | WEIGHT (g) vol % | 20.98 20.7 | 0.021 0.0 | 0.21 0.4 | 2.0 2.0 | 0.05 0.05 | 100 24.3 |
| REFERENCE EXAMPLE 3 | SMALL PARTICLE SIZE:LARGE PARTICLE SIZE = 2:5 | WEIGHT (g) vol % | 20.98 22.9 | 0.021 0.0 | 0.21 0.4 | 0.0 0.0 | 0.00 0.00 | 77.1 20.7 |
| COMPARATIVE EXAMPLE 3 | SMALL PARTICLE SIZE:LARGE PARTICLE SIZE = 1:3 | WEIGHT (g) vol % | 20.98 22.9 | 0.021 0.0 | 0.21 0.4 | 0.0 0.0 | 0.00 0.00 | 67.5 18.1 |

TABLE 2-2

| ITEM | BLENDED CONTENT | MATERIAL | ALUMINUM OXIDE | MAGNESIUM HYDROXIDE | SUM | THERMALLY CONDUCTIVE FILLER vol % WITH RESPECT TO TOTAL | VISCOSITY cP | HARDNESS ASKER C |
|---|---|---|---|---|---|---|---|---|
| | | PRODUCT NUMBER | | | | | | |
| | | SPECIFIC GRAVITY | 3.98 | 2.38 | | | | |
| | | AVERAGE PARTICLE SIZE | 75 | 1.1 | | | | |
| | | RANGE OF AVERAGE PARTICLE SIZE | 50-100 | 0.5-1.5 | | | | |
| COMPARATIVE EXAMPLE 2 | SMALL PARTICLE SIZE:LARGE PARTICLE SIZE = 1:1 | WEIGHT (g) vol % | 135 36.3 | 9 4.0 | 300.2 100.0 | 76.6 | 480,000 | 62 |
| REFERENCE EXAMPLE 1 | SMALL PARTICLE SIZE:LARGE PARTICLE SIZE = 2:3 | WEIGHT (g) vol % | 162 43.5 | 9 4.0 | 300.2 100.0 | 76.6 | 400,000 | 42 |
| REFERENCE EXAMPLE 2 | SMALL PARTICLE SIZE:LARGE PARTICLE SIZE = 1:2 | WEIGHT (g) vol % | 180 48.4 | 9 4.0 | 300.2 100.0 | 76.6 | 380,000 | 40 |
| EXAMPLE 2 | SMALL PARTICLE SIZE:LARGE PARTICLE SIZE = 1:2 | WEIGHT (g) vol % | 200 48.6 | 10.0 4.1 | 333.3 100.0 | 76.9 | 500,000 | — |
| REFERENCE EXAMPLE 3 | SMALL PARTICLE SIZE:LARGE PARTICLE SIZE = 2:5 | WEIGHT (g) vol % | 192.9 51.9 | 9 4.0 | 300.2 100.0 | 76.6 | 380,000 | 40 |

TABLE 2-2-continued

| ITEM | BLENDED CONTENT | MATERIAL | ALUMINUM OXIDE | MAGNESIUM HYDROXIDE | SUM | THERMALLY CONDUCTIVE FILLER vol % WITH RESPECT TO TOTAL | VISCOSITY cP | HARDNESS ASKER C |
|---|---|---|---|---|---|---|---|---|
| COMPARATIVE EXAMPLE 3 | SMALL PARTICLE SIZE:LARGE PARTICLE SIZE = 1:3 | WEIGHT (g) vol % | 202.5 54.4 | 9 4.0 | 300.2 100.0 | 76.6 | UNKNEADABLE | |

From the results shown in Tables 2-1 to 2-2, it was found that the Asker hardness became 62, which was too high, in Comparative Example 2 in which the blending proportion of the small particle size and that of the large particle size were equal. In Comparative Example 3, in which the blending proportion of the small particle size was ⅓ or less of that of the large particle size, the large particle size was so many that mixing and kneading became impossible. From this, at was confirmed that the blending proportions of the small particle size alumina (high-soda product): the large particle size alumina (high-soda product) were preferably in a range of 2:3 to 2:5.

3. Study on Addition Amount of Antioxidant

Sheet-shaped Samples having a sheet shape similar to the above were produced by blending various materials, with varying addition amount of the antioxidant with respect to 20.98 parts by weight of acrylic resin, according to the blending proportions shown in Tables 3-1 to 3-2 as follows: 0 part by weight (Comparative Example 4), 0.025 parts by weight (Example 3), 0.05 parts by weight (Example 4), 0.075 parts by weight (Example 5), 0.1 parts by weight (Example 6), and 0.3 parts by weight (Comparative Example 5).

Each of the obtained samples was measured for thermal resistance (test piece of size A) and compressive force required in a deformation with a compressibility of 20% (test piece of size B), similarly as above. Further, a sample with a test piece size of 20×20 mm×1 mm (test piece of size D) was placed still on a powder paper, and then subjected to a heat resistance test by being put in a heating device and being left for about 168 hours under a temperature condition of 40° C. Thereafter, an observation was conducted to check levels of oil bleeding. Results are also shown in Tables 3-1 to 3-2.

TABLE 3-1

| ITEM | BLENDED CONTENT | MATERIAL | ACRYLIC RESIN | POLY- FUNCTIONAL MONOMER | POLYMER- IZATION INITIATOR | PLASTI- CIZER | ANTI- OXIDANT | ALUMI- NUM OXIDE | ALUMI- NUM OXIDE |
|---|---|---|---|---|---|---|---|---|---|
| | | PRODUCT NUMBER | HD-A218 | 1.6HX-A | PERKADOX16 | | | | |
| | | SPECIFIC GRAVITY | 0.98 | 0.98 | 0.5 | 0.99 | 1.04 | 3.98 | 3.98 |
| | | AVERAGE PARTICLE SIZE | — | — | — | — | — | 3 | 75 |
| | | RANGE OF AVERAGE PARTICLE SIZE | — | — | — | — | — | 2-10 | 50-100 |
| COMPARATIVE EXAMPLE 4 | ANTIOXIDANT (0 vol %) | WEIGHT (g) vol % | 20.98 22.4 | 0.021 0.022 | 0.21 0.44 | 2.0 2.1 | 0 0.0 | 90 23.7 | 180 47.4 |
| EXAMPLE 3 | ANTIOXIDANT (0.03 vol %) | WEIGHT (g) vol % | 20.98 22.4 | 0.021 0.022 | 0.21 0.44 | 2.0 2.1 | 0.025 0.03 | 90 23.7 | 180 47.3 |
| EXAMPLE 4 | ANTIOXIDANT (0.05 vol %) | WEIGHT (g) vol % | 20.98 22.4 | 0.021 0.022 | 0.21 0.44 | 2.0 2.1 | 0.05 0.05 | 90 23.7 | 180 47.3 |
| EXAMPLE 5 | ANTIOXIDANT (0.08 vol %) | WEIGHT (g) vol % | 20.98 22.4 | 0.021 0.022 | 0.21 0.44 | 2.0 2.1 | 0.075 0.08 | 90 23.7 | 180 47.3 |
| EXAMPLE 6 | ANTIOXIDANT (0.1 vol %) | WEIGHT (g) vol % | 20.98 22.4 | 0.021 0.022 | 0.21 0.44 | 2.0 2.1 | 0.1 0.10 | 90 23.7 | 180 47.3 |
| COMPARATIVE EXAMPLE 5 | ANTIOXIDANT (0.3 vol %) | WEIGHT (g) vol % | 20.98 22.4 | 0.021 0.022 | 0.21 0.44 | 2.0 2.1 | 0.3 0.30 | 90 23.6 | 180 47.2 |

TABLE 3-2

| ITEM | BLENDED CONTENT | MATERIAL | MAGNESIUM HYDROXIDE | SUM | THERMALLY CONDUCTIVE FILLER vol % WITH RESPECT TO TOTAL | THERMAL RESISTANCE (° C./W) | COMPRESSION FORCE (N) | OIL BLEEDING | TOTAL |
|---|---|---|---|---|---|---|---|---|---|
| | | PRODUCT NUMBER | | | | | | | |
| | | SPECIFIC GRAVITY | 2.38 | | | | | | |
| | | AVERAGE PARTICLE SIZE | 1.1 | | | | | | |
| | | RANGE OF AVERAGE PARTICLE SIZE | 0.5-1.5 | | | | | | |
| COMPARATIVE EXAMPLE 4 | ANTIOXIDANT (0 vol %) | WEIGHT (g) vol % | 9 4.0 | 302.2 100.0 | 75.0 | 0.49 | LARGER THAN 200 | NO | NO GOOD |
| EXAMPLE 3 | ANTIOXIDANT (0.03 vol %) | WEIGHT (g) vol % | 9 4.0 | 302.2 100.0 | 75.0 | 0.45 | 160 TO 200 | NO | GOOD |
| EXAMPLE 4 | ANTIOXIDANT (0.05 vol %) | WEIGHT (g) vol % | 9 4.0 | 302.3 100.0 | 75.0 | 0.41 | 160 OR LESS | NO | GOOD |
| EXAMPLE 5 | ANTIOXIDANT (0.08 vol %) | WEIGHT (g) vol % | 9 4.0 | 302.3 100.0 | 74.9 | 0.40 | 160 OR LESS | NO | GOOD |
| EXAMPLE 6 | ANTIOXIDANT (0.1 vol %) | WEIGHT (g) vol % | 9 4.0 | 302.3 100.0 | 74.9 | 0.40 | 160 OR LESS | NO | GOOD |
| COMPARATIVE EXAMPLE 5 | ANTIOXIDANT (0.3 vol %) | WEIGHT (g) vol % | 9 3.9 | 302.5 100.0 | 74.8 | MATERIAL UNCURED | | NO | NO GOOD |

From the results shown in Tables 3-1 to 3-2, it was confirmed that a thermal resistance and a compressive force was decreased when the blending proportion of an antioxidant was set between 0.025 and 0.1 parts by weight. When an antioxidant was not included, a compressive force became 200 N or more. When an antioxidant was increased to exceed 0.3 parts by weight, a material was not cured. This is considered because a polymerization of an acrylic resin was suppressed by the antioxidant.

4. Study on Addition Amount of Plasticizer

Samples having a sheet shape similar to the above were produced by blending various materials, with varying addition amount of the plasticizer with respect to 20.98 parts by weight of acrylic resin according to the blending proportions shown in Tables 4-1 to 4-2 as follows: 0 part by weight (Comparative Example 6), 1.0 part by weight (Comparative Example 7). 1.5 parts by weight (Example 7), 2.0 parts by weight (Example 8) 2.5 parts by weight (Example 9), and 3.0 parts by weight (Comparative Example 8).

Each of the obtained samples was measured for thermal resistance (test piece of size A) and compressive force required in a deformation with a compressibility of 20% (test piece of size B), similarly as above. Further, a heat resistance test was conducted similarly as above, and an observation was conducted to check level of oil bleeding (test piece of size D). Results are also shown in Tables 4-1 to 4-2.

TABLE 4-1

| ITEM | BLENDED CONTENT | MATERIAL | ACRYLIC RESIN | POLYFUNCTIONAL MONOMER | POLYMERIZATION INITIATOR | PLASTICIZER | ANTIOXIDANT | ALUMINUM OXIDE | ALUMINUM OXIDE |
|---|---|---|---|---|---|---|---|---|---|
| | | PRODUCT NUMBER | HD-A218 | 1.6HX-A | PERKAD0X16 | | | | |
| | | SPECIFIC GRAVITY | 0.98 | 0.98 | 0.5 | 0.99 | 1.04 | 3.98 | 3.98 |
| | | AVERAGE PARTICLE SIZE | — | — | — | — | — | 3 | 75 |
| | | RANGE OF AVERAGE PARTICLE SIZE | — | — | — | — | — | 2-10 | 50-100 |
| COMPARATIVE EXAMPLE 6 | PLASTICIZER (0 vol %) | WEIGHT (g) vol % | 20.98 22.9 | 0.021 0.023 | 0.21 0.45 | 0.0 0.0 | 0.05 0.1 | 90 24.2 | 180 48.4 |
| COMPARATIVE EXAMPLE 7 | PLASTICIZER (1.1 vol %) | WEIGHT (g) vol % | 20.98 22.6 | 0.021 0.023 | 0.21 0.44 | 1.0 1.1 | 0.05 0.05 | 90 23.9 | 180 47.8 |
| EXAMPLE 7 | PLASTICIZER (1.6 vol %) | WEIGHT (g) vol % | 20.98 22.5 | 0.021 0.023 | 0.21 0.44 | 1.5 1.6 | 0.05 0.05 | 90 23.8 | 180 47.6 |
| EXAMPLE 8 | PLASTICIZER (2.1 vol %) | WEIGHT (g) vol % | 20.98 22.4 | 0.021 0.022 | 0.21 0.44 | 2.0 2.1 | 0.05 0.05 | 90 23.7 | 180 47.3 |
| EXAMPLE 9 | PLASTICIZER (2.6 vol %) | WEIGHT (g) vol % | 20.98 22.3 | 0.021 0.022 | 0.21 0.44 | 2.5 2.6 | 0.05 0.05 | 90 23.5 | 180 47.1 |

TABLE 4-1-continued

| ITEM | BLENDED CONTENT | MATERIAL | ACRYLIC RESIN | POLY-FUNCTIONAL MONOMER | POLYMER-IZATION INITIATOR | PLASTI-CIZER | ANTI-OXIDANT | ALUMI-NUM OXIDE | ALUMI-NUM OXIDE |
|---|---|---|---|---|---|---|---|---|---|
| COMPARATIVE EXAMPLE 8 | PLASTICIZER (3.1 vol %) | WEIGHT (g) vol % | 20.98 22.2 | 0.021 0.022 | 0.21 0.44 | 3.0 3.1 | 0.05 0.05 | 90 23.4 | 180 46.8 |

TABLE 4-2

| ITEM | BLENDED CONTENT | MATERIAL | MAGNESIUM HYDROXIDE | SUM | THERMALLY CONDUCTIVE FILLER vol % WITH RESPECT TO TOTAL | THERMAL RESISTANCE (° C./W) | COMPRES-SION FORCE (N) | OIL BLEEDING | TOTAL |
|---|---|---|---|---|---|---|---|---|---|
| | | PRODUCT NUMBER | | | | | | | |
| | | SPECIFIC GRAVITY | 2.38 | | | | | | |
| | | AVERAGE PARTICLE SIZE | 1.1 | | | | | | |
| | | RANGE OF AVERAGE PARTICLE SIZE | 0.5-1.5 | | | | | | |
| COMPARATIVE EXAMPLE 6 | PLASTICIZER (0 vol %) | WEIGHT (g) vol % | 9 4.0 | 300.3 100.0 | 76.6 | 0.48 | LARGER THAN 200 | NO | NO GOOD |
| COMPARATIVE EXAMPLE 7 | PLASTICIZER (1.1 vol %) | WEIGHT (g) vol % | 9 4.0 | 301.3 100.0 | 75.8 | 0.48 | LARGER THAN 200 | NO | NO GOOD |
| EXAMPLE 7 | PLASTICIZER (1.6 vol %) | WEIGHT (g) vol % | 9 4.0 | 301.8 100.0 | 75.4 | 0.43 | 160 TO 200 | NO | GOOD |
| EXAMPLE 8 | PLASTICIZER (2.1 vol %) | WEIGHT (g) vol % | 9 4.0 | 302.3 100.0 | 75.0 | 0.41 | 160 OR LESS | NO | GOOD |
| EXAMPLE 9 | PLASTICIZER (2.6 vol %) | WEIGHT (g) vol % | 9 3.9 | 302.8 100.0 | 74.6 | 0.41 | 160 OR LESS | NO | GOOD |
| COMPARATIVE EXAMPLE 8 | PLASTICIZER (3.1 vol %) | WEIGHT (g) vol % | 9 3.9 | 303.3 100.0 | 74.2 | 0.50 | 160 OR LESS | YES | NO GOOD |

From the results shown in Tables 4-1 to 4-2, it was confirmed that the thermal resistance and the compressive force were both decreased when the blending proportion of a plasticizer was set between 1.5 parts by weight and 2.5 parts by weight. When an amount of a plasticizer was smaller than 1.0 part by weight, the compressive force became larger than 200 N. When the plasticizer exceeded 3.0 parts by weight, the thermal resistance was increased and the oil bleeding was observed, which were not preferred.

5. Study on Addition Amount of Magnesium Hydroxide

Samples having a sheet shape similar to the above were produced by blending various materials, with varying addition amount of the magnesium hydroxide coated with a higher fatty acid according to the blending proportions shown in Tables 5-1 to 5-2 as follows: 1.4% by volume (Comparative Example 9), 2.7% by volume (Reference Example 4), 4.0% by volume (Reference Example 5), 5.3% by volume (Reference Example 6), 6.6% by volume (Comparative Example 10).

The materials obtained in the mixing step were measured for viscosity coefficient similarly as above, and an observation of thixotropy was conducted. In addition, the obtained samples of the test pieces of size C were measured for Asker C hardness. Results are also shown in Tables 5-1 to 5-2.

TABLE 5-1

| ITEM | BLENDED CONTENT | MATERIAL | ACRYLIC RESIN | POLY-FUNCTIONAL MONOMER | POLYMER-IZATION INITIATOR | ALUMINUM OXIDE | ALUMINUM OXIDE | MAGNESIUM HYDROXIDE |
|---|---|---|---|---|---|---|---|---|
| | | PRODUCT NUMBER | HD-A218 | 1.6HX-A | PERKADOX16 | | | |
| | | SPECIFIC GRAVITY | 0.98 | 0.98 | 0.5 | 3.98 | 3.98 | 2.38 |
| | | AVERAGE PARTICLE SIZE | — | — | — | 3 | 75 | 1.1 |
| | | RANGE OF AVERAGE PARTICLE SIZE | — | — | — | 2-10 | 50-100 | 0.5-1.5 |

TABLE 5-1-continued

| ITEM | BLENDED CONTENT | MATERIAL | ACRYLIC RESIN | POLY-FUNCTIONAL MONOMER | POLYMER-IZATION INITIATOR | ALUMINUM OXIDE | ALUMINUM OXIDE | MAGNESIUM HYDROXIDE |
|---|---|---|---|---|---|---|---|---|
| COMPARATIVE EXAMPLE 9 | MAGNESIUM HYDROXIDE (1.4 vol %) | WEIGHT (g) vol % | 20.98 23.5 | 0.021 0.0 | 0.21 0.5 | 90 24.9 | 180 49.7 | 3 1.4 |
| REFERENCE EXAMPLE 4 | MAGNESIUM HYDROXIDE (2.7 vol %) | WEIGHT (g) vol % | 20.98 23.2 | 0.021 0.0 | 0.21 0.5 | 90 24.5 | 180 49.0 | 6 2.7 |
| REFERENCE EXAMPLE 5 | MAGNESIUM HYDROXIDE (4.0 vol %) | WEIGHT (g) vol % | 20.98 22.9 | 0.021 0.0 | 0.21 0.4 | 90 24.2 | 180 48.4 | 9 4.0 |
| REFERENCE EXAMPLE 6 | MAGNESIUM HYDROXIDE (5.3 vol %) | WEIGHT (g) vol % | 20.98 22.6 | 0.021 0.0 | 0.21 0.4 | 90 23.9 | 180 47.7 | 12 5.3 |
| COMPARATIVE EXAMPLE 10 | MAGNESIUM HYDROXIDE (6.6 vol %) | WEIGHT (g) vol % | 20.98 22.3 | 0.021 0.0 | 0.21 0.4 | 90 23.6 | 180 47.1 | 15 6.6 |

TABLE 5-2

| ITEM | BLENDED CONTENT | MATERIAL | SUM | THERMALLY CONDUCTIVE FILLER vol % WITH RESPECT TO TOTAL | VISCOSITY cP | THIXOTROPY | HARDNESS ASKER C |
|---|---|---|---|---|---|---|---|
| | | PRODUCT NUMBER SPECIFIC GRAVITY AVERAGE PARTICLE SIZE RANGE OF AVERAGE PARTICLE SIZE | | | | | |
| COMPARATIVE EXAMPLE 9 | MAGNESIUM HYDROXIDE (1.4 vol %) | WEIGHT (g) vol % | 294.2 100.0 | 76.0 | 450,000 | DEFOAMABLE | 48 |
| REFERENCE EXAMPLE 4 | MAGNESIUM HYDROXIDE (2.7 vol %) | WEIGHT (g) vol % | 297.2 100.0 | 76.3 | 400,000 | DEFOAMABLE | 42 |
| REFERENCE EXAMPLE 5 | MAGNESIUM HYDROXIDE (4.0 vol %) | WEIGHT (g) vol % | 300.2 100.0 | 76.6 | 380,000 | DEFOAMABLE | 40 |
| REFERENCE EXAMPLE 6 | MAGNESIUM HYDROXIDE (5.3 vol %) | WEIGHT (g) vol % | 303.2 100.0 | 76.9 | 380,000 | DEFOAMABLE | 40 |
| COMPARATIVE EXAMPLE 10 | MAGNESIUM HYDROXIDE (6.6 vol %) | WEIGHT (g) vol % | 306.2 100.0 | 77.2 | 400,000 | UNDEFOAMABLE | 42 |

From the results shown in Tables 3-1 to 5-2, it was confirmed that a low viscosity, a good thixotropy, and a low Asker hardness were obtained, when blending proportion of the magnesium hydroxide coated with a higher fatty acid was set between 2.7 and 5.3% by volume. A too small addition amount of magnesium hydroxide as small as 1.4% by volume (Comparative Example 9) increased the viscosity as well as the Asker hardness. An addition amount exceeding 5.3% by volume (Comparative Example 10) made a defoaming difficult and increased a hardness. This is considered because the magnesium hydroxide contributed to a sliding property between the thermally conductive fillers.

OTHER EMBODIMENTS

The present invention is not limited to the embodiments as described by the descriptions above and drawings, but also involves, for example, another embodiment as follows in the technical scope of the present invention.

In the embodiment described above, the thermally conductive fillers were composed of a mixture of two kinds that were small article size alumina with an average particle size of 2 μm to 10 μm and large particle size alumina with an average particle size of 50 μm to 100 μm, both of which have a substantially spherical shape. As a reference example, the structure may further include a silicon carbide in a polygonal shape with an average particle size ranging from 50 μm to 100 μm, or the like. Tables 6-1 to 6-2 shows an example of blending proportions of materials and test results in this case.

TABLE 6-1

| ITEM | BLENDED CONTENT | MATERIAL | ACRYLIC RESIN | POLY-FUNCTIONAL MONOMER | POLYMER-IZATION INITIATOR | PLASTI-CIZER | ANTI-OXIDANT | ALUMI-NUM OXIDE | ALUMI-NUM OXIDE |
|---|---|---|---|---|---|---|---|---|---|
| | | PRODUCT NUMBER | HD-A218 | 1.6HX-A | PERKAD0X16 | | | | |
| | | SPECIFIC GRAVITY | 0.98 | 0.98 | 0.5 | 0.99 | 1.04 | 3.98 | 3.98 |
| | | AVERAGE PARTICLE SIZE | — | — | — | — | — | 3 | 75 |
| | | RANGE OF AVERAGE PARTICLE SIZE | — | — | — | — | — | 2-10 | 50-100 |
| REFERENCE EXAMPLE 7 | SMALL PARTICLE SIZE:EXTRA-LARGE PARTICLE SIZE = 1:2 SILICON CARBIDE USED | WEIGHT (g) vol % | 20.98 23.2 | 0.021 0.0 | 0.21 0.5 | 2.0 2.2 | 0.05 0.1 | 83 22.6 | 110 29.9 |

TABLE 6-2

| ITEM | BLENDED CONTENT | MATERIAL | SILICON CARBIDE | MAGNESIUM HYDROXIDE | SUM | THERMALLY CONDUCTIVE FILLER vol % WITH RESPECT TO TOTAL | THERMAL CONDUCTIVITY COEFFICIENT W/m · K | HARDNESS ASKER C |
|---|---|---|---|---|---|---|---|---|
| | | PRODUCT NUMBER | GC F180 | | | | | |
| | | SPECIFIC GRAVITY | 3.5 | 2.38 | | | | |
| | | AVERAGE PARTICLE SIZE | 63 | 1.1 | | | | |
| | | RANGE OF AVERAGE PARTICLE SIZE | 50-100 | 0.5-1.5 | | | | |
| REFERENCE EXAMPLE 7 | SMALL PARTICLE SIZE:EXTRA-LARGE PARTICLE SIZE = 1:2 SILICON CARBIDE USED | WEIGHT (g) vol % | 55.0 17.0 | 9.9 4.5 | 281.2 100.0 | 74.1 | 3.80 | 32 |

EXPLANATION OF SYMBOLS

10: Coater
11: Hopper
13: Roll
14: Polymeric film
15: Heating device

The invention claimed is:

1. A thermally conductive sheet comprising:
an acrylic polymer;
a high-soda alumina in an amount of 70 to 75% by volume based on a total thermally conductive sheet volume; and
a magnesium hydroxide having a particle size smaller than a particle size of the high-soda alumina in an amount of 2.7 to 5.3% by volume based on a total thermally conductive sheet volume, wherein the magnesium hydroxide is coated with a higher fatty acid, and wherein:

the thermally conductive sheet has a compressive force required in a deformation with a compressibility of 20% of 200 N or less, and the thermally conductive sheet has a thermal resistance of 0.45° C./W or less.

2. The thermally conductive sheet according to claim 1, wherein the high-soda alumina is prepared by mixing a small particle size alumina with an average particle size of 2 μm to 10 μm and a large particle size alumina with an average particle size of 50 μm to 100 at a volume ratio of 2:3 to 2:5.

3. A method for manufacturing the thermally conductive sheet according to claim 1, the method comprising:

a mixing step of mixing
an acrylic resin in an amount of 20 to 25 parts by weight, wherein the acrylic resin comprises a monomer of (meth)acrylic acid ester and a polymer prepared by polymerizing a monomer comprising a (meth)acrylic acid ester,
a high-soda alumina in an amount of 250 to 300 parts by weight with respect to 20 to 25 parts by weight of the acrylic resin,
a magnesium hydroxide in an amount of 4 to 13 parts by weight with respect to 20 to 25 parts by weight of the acrylic resin, wherein the magnesium hydroxide has a particle size smaller than a particle size of the high-soda alumina and is coated with a higher fatty acid,
a polyfunctional monomer in an amount of 0.005 to 0.05 parts by weight with respect to 20 to 25 parts by weight of the acrylic resin,
a polymerization initiator in an amount of 0.1 to 0.3 parts by weight with respect to 20 to 25 parts by weight of the acrylic resin,
a plasticizer in an amount of 1.2 to 2.8 parts by weight with respect to 20 to 25 parts by weight of the acrylic resin, and
an antioxidant in an amount of 0.02 to 0.2 parts by weight with respect to 20 to 25 parts by weight of the acrylic resin;
a forming step of forming a mixture obtained in the mixing step into a sheet shape by extruding the mixture toward between a pair of plastic sheets facing each other; and
a curing step of heating and curing a formed material formed in the forming step.

4. A method for manufacturing the thermally conductive sheet according to claim 2, the method comprising:
a mixing step of mixing
an acrylic resin in an amount of 20 to 25 parts by weight, wherein the acrylic resin comprises a monomer of (meth)acrylic acid ester and a polymer prepared by polymerizing a monomer comprising a (meth)acrylic acid ester,
a high-soda alumina in an amount of 250 to 300 parts by weight with respect to 20 to 25 parts by weight of the acrylic resin,
a magnesium hydroxide in an amount of 4 to 13 parts by weight with respect to 20 to 25 parts by weight of the acrylic resin, wherein the magnesium hydroxide has a particle size smaller than a particle size of the high-soda alumina and is coated with a higher fatty acid,
a polyfunctional monomer in an amount of 0.005 to 0.05 parts by weight with respect to 20 to 25 parts by weight of the acrylic resin,
a polymerization initiator in an amount of 0.1 to 0.3 parts by weight with respect to 20 to 25 parts by weight of the acrylic resin,
a plasticizer in an amount of 1.2 to 2.8 parts by weight with respect to 20 to 25 parts by weight of the acrylic resin, and
an antioxidant in an amount of 0.02 to 0.2 parts by weight with respect to 20 to 25 parts by weight of the acrylic resin;
a forming step of forming a mixture obtained in the mixing step into a sheet shape by extruding the mixture toward between a pair of plastic sheets facing each other; and
a curing step of heating and curing a formed material formed in the forming step.

\* \* \* \* \*